United States Patent [19]
Shinozaki

[11] Patent Number: 5,280,196
[45] Date of Patent: Jan. 18, 1994

[54] MAGNETIC HEAD DRIVE CIRCUIT

[75] Inventor: Eiji Shinozaki, Tokyo, Japan

[73] Assignee: Nec Corporation, Tokyo, Japan

[21] Appl. No.: 42,940

[22] Filed: Apr. 5, 1993

[30] Foreign Application Priority Data

Apr. 8, 1992 [JP] Japan ................. 4-086810

[51] Int. Cl.⁵ .................... H03K 3/01; H03K 19/02
[52] U.S. Cl. .................... 307/270; 307/446;
   307/246; 307/570; 360/46; 360/67; 360/68
[58] Field of Search ............ 307/446, 570, 246, 270;
   360/46, 67-68

[56] References Cited

U.S. PATENT DOCUMENTS 5,155,387 10/1992 Fletcher et al. ............. 307/570
5,166,837 11/1992 Nakamura ................... 360/460

FOREIGN PATENT DOCUMENTS 2352381 4/1975 Fed. Rep. of Germany ...... 307/570
0022827 2/1985 Japan ........................ 307/570

Primary Examiner—Margaret R. Wambach

[57] ABSTRACT

A magnetic head drive circuit includes a first MOS transistor of a first conductivity type, a bipolar transistor of a second conductivity type, a second MOS transistor of the second conductivity type, a second bipolar transistor of the first conductivity type. The first MOS transistor of a first conductivity type has a source connected to a first power supply. The first bipolar transistor of a second conductivity type is connected in series with the first MOS transistor and has a common node thereof as a first output terminal, an emitter connected to a second power supply, and a collector current controlled as a constant current. The second MOS transistor of the second conductivity type has a source connected to the first power supply. The second bipolar transistor of the first conductivity type is connected in series with the second MOS transistor and has a common node thereof as a second output terminal, an emitter connected to the second power supply, and a collector current controlled as a constant current.

5 Claims, 3 Drawing Sheets

MAGNETIC HEAD DRIVE CIRCUIT

BACKGROUND OF THE INVENTION

The present invention relates to a magnetic head drive circuit and, more particularly, to a magnetic head drive circuit for data write access in a hard or flexible disk drive in a data processing apparatus.

A dive current for a magnetic head must be reversed for data write access in a magnetic recording apparatus such as a hard or flexible disk drive. As shown in FIG. 3, a conventional magnetic head drive circuit for driving a magnetic head (e.g., a thin film head) having no center point of a winding comprises a bridge circuit 2 for current-driving a magnetic head 4 and a drive circuit 3 for driving the bridge circuit 2.

The bridge circuit 2 comprises series-connected bipolar transistors Q21 and Q23 having an output terminal O1 at their connecting node, and series-connected bipolar transistors Q22 and Q24 having an output terminal O2 at their connecting node. The collectors of the bipolar transistors Q21 and Q22 are commonly connected, and the common node is connected to a power supply VCC. The emitters of the transistors Q23 and Q24 are commonly connected, and the common node is connected to ground G through a constant current source I21. The constant current source I21 comprises a transistor Q25 controlled by a reference current source RI21 constituted by an input circuit as a current mirror circuit (not shown) and a resistor R21 connected between the emitter of the transistor Q25 and the ground G.

The drive circuit 3 comprises transistors Q31 and Q32 constituting a differential amplifier and having load resistors R31 and R32 connected to a power supply VCC, a constant current source I31 connected to the common node of the emitters of the transistors Q31 and Q32, switching signal sources S31 and S32 having bases for receiving rectangular wave switching signals having the same amplitude but opposite polarities, and a bias power supply VB31. The constant current source I31 comprises a transistor Q33 controlled by the reference current source RI31 and a resistor R33 connected between the emitter of the transistor Q33 and the ground G.

The collectors of the transistors Q31 and Q32 of the drive circuit 3 are respectively connected to the bases of the transistors Q21 and Q22 of the bridge circuit 2. The bases of the transistors Q31 and Q32 of the drive circuit 3 are respectively connected to the bases of the transistors Q23 and Q24 of the bridge circuit 2.

An operation of the conventional magnetic head drive circuit will be described below.

When the output polarity of the switching signal source S31 is positive (about 0.25 V) and the output polarity of the switching signal source S32 is negative, the transistors Q23 and Q24 constituting the differential amplifier of the bridge circuit 2 are turned on and off, respectively. An output current from the constant current source I21 entirely serves as an emitter current of the transistor Q23, and a collector current therefrom has almost the same magnitude as that of the emitter current. At the same time, the transistors Q31 and Q32 constituting the differential amplifier of the drive circuit 3 are turned on and off, respectively. An output current from the constant current source I31 entirely serves as an emitter current of the transistor Q31, and a collector current therefrom has almost the same magnitude as that of the emitter current. Although a voltage drop occurs across the load resistor R31 of the transistor Q31, a voltage drop does not occur across the load resistor R32 of the transistor Q32. The base potential of the transistor Q21 in the bridge circuit 2 is set lower than that of the transistor Q22. The DC resistance of the magnetic head 4 is regarded as almost zero, so that the output terminals O1 and O2 are short-circuited. The emitters of the transistors Q21 and Q22 are commonly connected in a DC manner to constitute a differential amplifier. For this reason, the transistor Q21 is turned off, and the transistor Q22 is turned on. Therefore, a drive current for the magnetic head 4 flows from the power supply VCC to the constant current source I21 through the transistor Q22, the output terminal O2, the magnetic head 4, the output terminal O1, and the transistor 21 in the order named.

When the output polarity of the switching signal source S32 is positive and the output polarity of the switching signal source S31 is negative, the ON/OFF states of the transistors Q21 and Q22 and the transistors Q23 and Q24 of the bridge circuit which constitute differential amplifiers and the transistors Q31 and Q32 of the drive circuit 3 are reversed. Therefore, the direction of the drive current for the magnetic head 4 is reversed.

The operation in the normal state has been described above. In a transient state upon reversing the direction of the drive current, the following problem is posed.

Assume that the transistors Q21 and Q24 of the bridge circuit 2 are set in an ON state, and that a drive current flows from the output terminal 01 to the output terminal 02 through the magnetic head 4. When the output polarities of the switching signal sources S31 and S32 are reversed to reverse the direction of the drive current, the transistor Q24 is turned off, and at the same time the transistor Q23 is turned on, so that the current from the output terminal O2 tends to be drawn. At this time, a flyback pulse as a pulsed voltage which decreases the voltage at the output terminal O1 and increases the voltage at the output terminal O2 is generated by the inductance of the magnetic head 4. The collector potential of the transistor Q23 set in the ON state is decreased and finally saturated to disable drawing of the drive current. In the normal state, the emitter potential of the transistor 22 set in the ON state is also increased and turned off, and the transistor Q21 whose emitter current is decreased is undesirably turned on. This state is called a flyback pulse clamp.

In a magnetic recording apparatus of this type, the output voltage of the magnetic head in the read mode is generally increased and interference between the recording signals is generally minimized at a higher reversing speed of the drive current in the write mode of the magnetic head. For this reason, an error rate is decreased, and the recording density can be increased. The flyback pulse clamp must be prevented to increase the reversing speed of the drive current.

The limit of turning on the transistor Q22 of the bridge circuit 2 is its emitter potential defined by subtracting the base-emitter voltage (i.e., 0.75 V) of the transistor Q22 in the ON state from the voltage of the power supply VCC. For example, if the voltage of the power supply VCC is given as 5 V, this emitter potential is 4.25 V or less. A voltage across the resistor R21 and a collector-emitter voltage of the transistor Q25 must be set to 0.3 V and 0.5 V, respectively, in normal design so as to normally operate the constant current source I21. The minimum collector potential of the transistor Q25 must be 0.8 V. A collector-emitter voltage which operates the transistor Q24 without saturation is 0.5 V. The minimum collector potential of the transistor Q24 becomes 1.5 V because a margin for properly turning on the transistor Q24 as 0.2 V is added. As a result, the limit of preventing the flyback pulse clamp occurring in the magnetic head 4 so as to keep the transistors Q22 and Q24 on is 2.75 V (=4.25 V−1.5 V).

In the conventional magnetic head drive circuit described above, the voltage at which the flyback pulse generated by the inductance of the magnetic head is clamped is low, and it is therefore difficult to increase the reversing speed of the magnetic head drive current so as to increase the write speed.

SUMMARY OF THE INVENTION

It is an object of the present invention to provide a magnetic head drive circuit capable of increasing the switching speed of current reversing to increase a write speed.

It is another object of the present invention to provide a magnetic head drive circuit capable of increasing a voltage at which a flyback pulse generated by the inductance of a magnetic head is clamped.

In order to achieve the above objects of the present invention, there is provided a magnetic head drive circuit comprising a first MOS transistor of a first conductivity type having a source connected to a first power supply, a first bipolar transistor of a second conductivity type connected in series with the first MOS transistor and having a common node thereof as a first output terminal, an emitter connected to a second power supply, and a collector current controlled as a constant current, a second MOS transistor of the second conductivity type having a source connected to the first power supply, and a second bipolar transistor of the first conductivity type connected in series with the second MOS transistor and having a common node thereof as a second output terminal, an emitter connected to the second power supply, and a collector current controlled as a constant current.

DESCRIPTION OF THE PREFERRED EMBODIMENTS

Preferred embodiments of the present invention will be described below with reference to the accompanying drawings.

Figure 1:
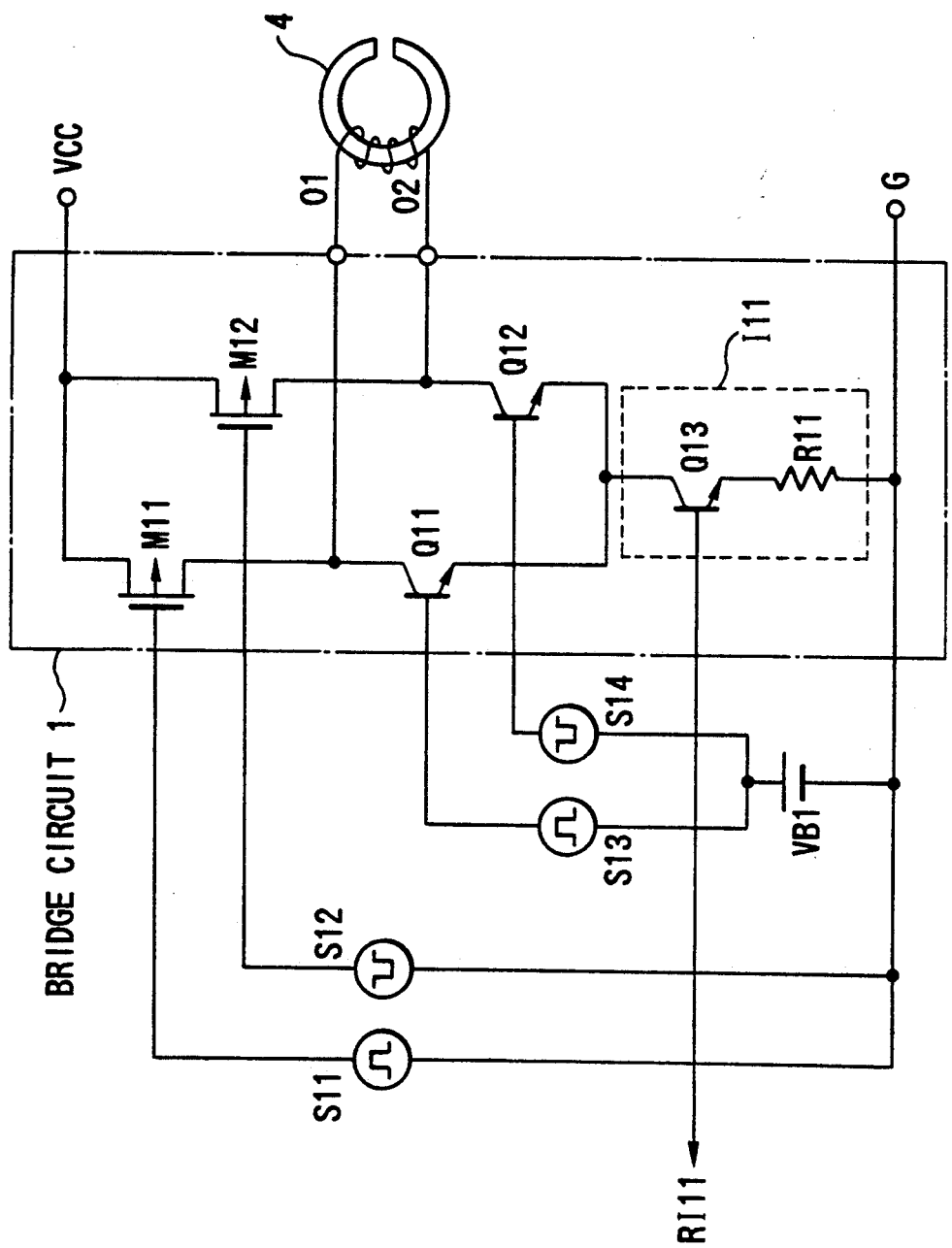
FIG. 1 is a circuit diagram showing a magnetic head drive circuit according the first embodiment of the present invention.

FIG. 1 shows a magnetic head drive circuit according to the first embodiment of the present invention.

As shown in FIG. 1, the magnetic head drive circuit of this embodiment comprises a bridge circuit 1 for current-driving a magnetic head 4, switching signal sources S11 to S14 for driving the bridge circuit 1, and a bias voltage source VB1.

The bridge circuit 1 comprises a p-channel MOS transistor M11 and a bipolar npn transistor Q11 which are connected in series with each other and have an output terminal O1 at their connecting node, and a p-channel MOS transistor M12 and a bipolar npn transistor Q12 which are connected in series with each other as in the transistors M11 and Q11 and have an output terminal O2 as their connecting node. The sources of the MOS transistors M11 and M12 are commonly connected, and the common node is connected to a power supply VCC. The emitters of the transistors Q11 and Q12 are commonly connected, and the common node is connected to ground G through a constant current source I11. The constant current source I11 comprises a transistor Q13 controlled by a reference current source RI11 constituted by an input circuit as a current mirror circuit (not shown) and a resistor R11 connected between the emitter of the transistor Q13 and the ground G.

In-phase switching signals output from the switching signal sources S11 and S13 have a polarity opposite to that of in-phase switching signals output from the switching signal sources S12 and S14.

An operation of the magnetic head drive circuit will be described below.

When the output polarity of the switching signal sources S11 and S13 is positive and the output polarity of the switching signal sources S12 and S14 is negative, the MOS transistor M12 and the transistor Q11 of the bridge circuit 1 are turned on, and the MOS transistor M11 and the transistor Q12 of the bridge circuit 1 are turned off. A drive current for a magnetic head 4 flows from the power supply VCC to the constant current source I11 through the MOS transistor M12, the output terminal O2, the magnetic head 4, the output terminal O1, and the transistor Q11 in the order named.

When the output polarity of the switching signal sources S11 and S13 is negative and the output polarity of the switching signal sources S12 and S14 is positive, the MOS transistor M11 and the transistor Q12 of the bridge circuit 1 are turned on, and the MOS transistor M12 and the transistor Q11 of the bridge circuit 1 are turned off. The drive current for the magnetic head 4 is reversed to flow from the power supply VCC to the constant current source I11 through the MOS transistor M11, the output terminal O1, the magnetic head 4, the output terminal O2, and the transistor Q12 in the order named.

A voltage for preventing clamping of a flyback pulse generated upon reversing the drive current will be taken into consideration. The constant current source I11 and the transistor Q12 are the same as the constant current source I21 and the transistor Q24 of the conventional example. The minimum collector potential of the transistor Q12 is 1.5 V. A necessary source-drain voltage of the MOS transistor M11 to keep it on is about 0.3 V although this value depends on a current value and a transistor size. The limit of preventing clamping of the flyback pulse generated by the magnetic head 4 is 3.2 V (=5.0 V−0.3 V−1.5 V). That is, the limit can be higher than the conventional example by 0.45 V.

The second embodiment of the present invention will be described below.

Figure 2:
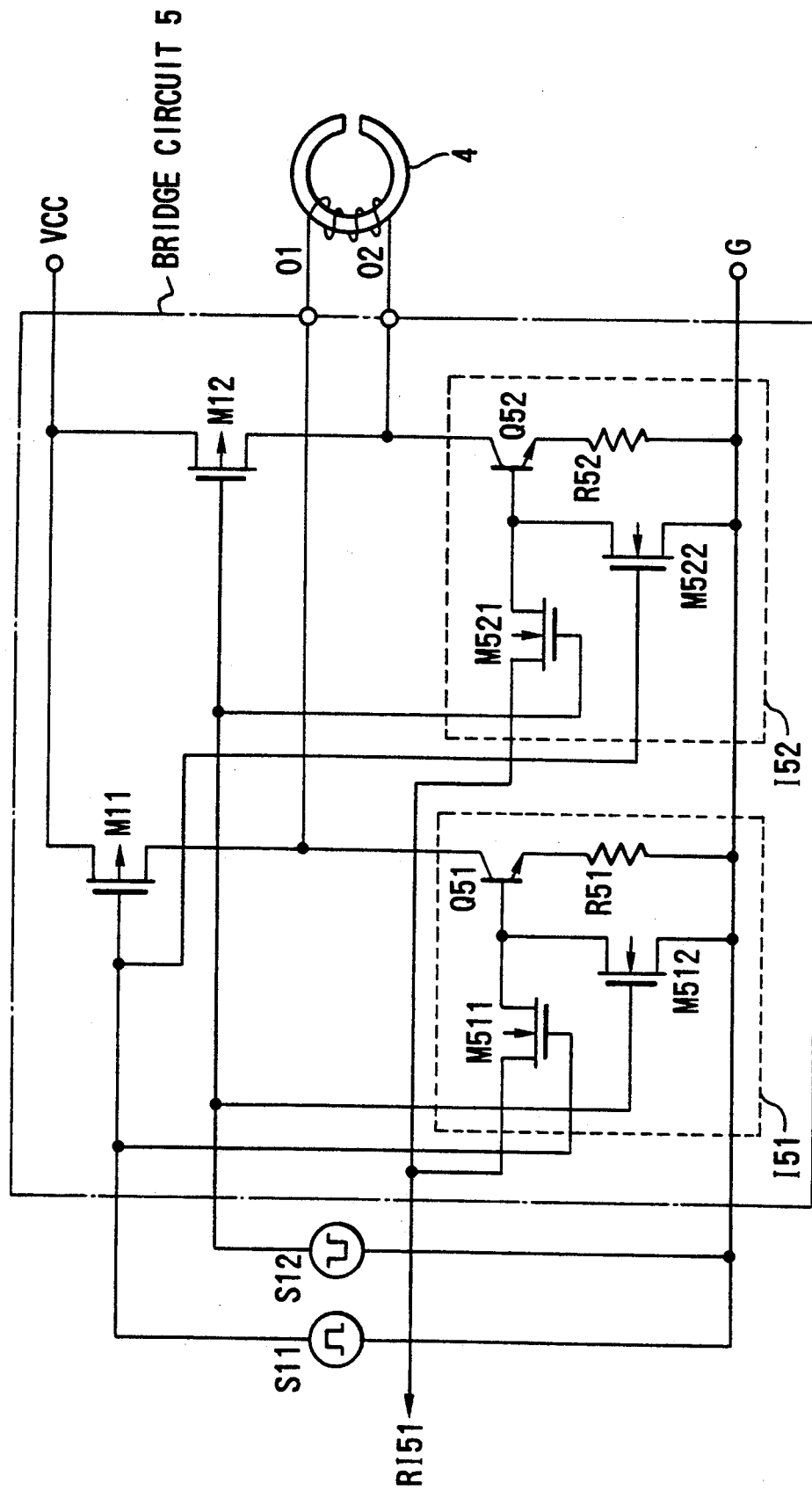
FIG. 2 is a circuit diagram showing a magnetic head drive circuit according to the second embodiment of the present invention.
Figure 3:
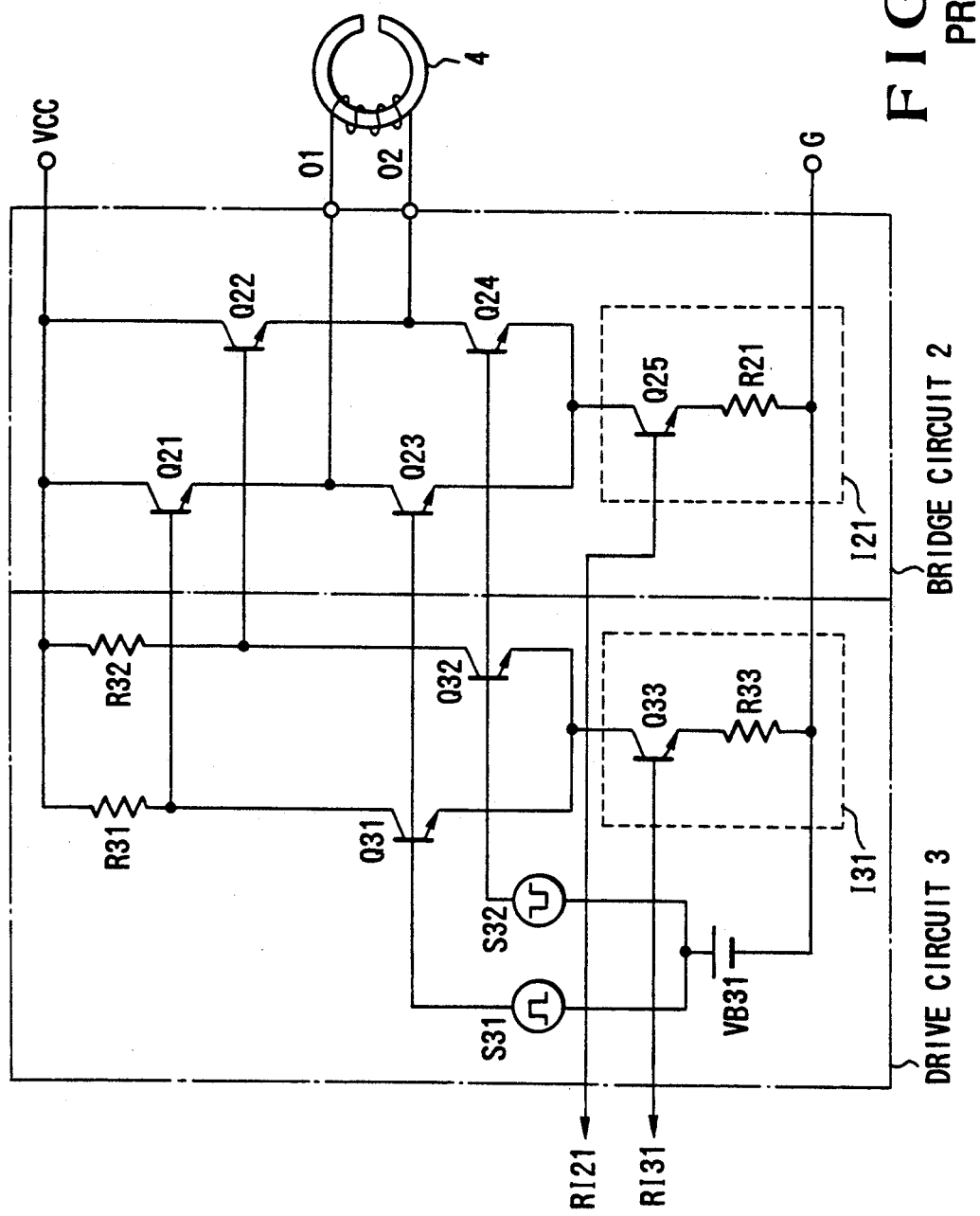
FIG. 3 is a circuit diagram of a conventional magnetic head drive circuit.

FIG. 2 shows the second embodiment of the present invention. The second embodiment is different from the first embodiment in that a bridge circuit 5 having a constant current source I51 having a transistor Q51, n-channel MOS transistors M511 and M512, and a resistor R51, and a constant current source I52 having a transistor Q52, n-channel MOS transistors M521 and M522, and a resistor R52 is arranged in place of the bridge circuit 1 (FIG. 1) having the transistors Q11 and Q12 and the constant current source I11. The collector of the transistor Q51 is connected to the MOS transistor M11, the emitter of the transistor Q51 is connected to ground G through the resistor R51, and the base of the transistor Q51 is connected to a reference current source RI51 through the MOS transistor M511 and to the ground G through the MOS transistor M512. The collector of the transistor Q52 is connected to the MOS transistor M12, the emitter of the transistor Q52 is connected to the ground G through the resistor R52, and the base of the transistor Q52 is connected to the reference current source RI51 through the MOS transistor M521 and to the ground G through the MOS transistor M522. The constant current sources I51 and I52 are controlled by the reference current source RI51 constituted by a current mirror input circuit (not shown). In this embodiment, only switching signal sources S11 and S12 for outputting opposite-phase switching signals are used. The gates of the MOS transistors M511 and M522 are connected to the switching signal source S11, and the gates of the MOS transistors M512 and the M521 are connected to the switching signal source S12.

An operation of this embodiment will be described below.

When the output polarity of the switching signals source S11 is positive and the output polarity of the switching signal source S12 is negative, the MOS transistors M12, M511, and M522 are set in an ON state, and the MOS transistors M11, M512, and M521 are set in an OFF state. In the constant current source I51, the base of the transistor Q51 is connected to the transistor of the current mirror input circuit (not shown) through the MOS transistor M511 set in the ON state. The transistor Q51 is driven to output a constant collector current. In the constant current source I52, the base of the transistor Q52 is connected to the ground G through the MOS transistor M522 set in the ON state. The transistor Q52 is turned off. Therefore, the drive current for the magnetic head 4 flows from the power supply VCC in an order of the MOS transistor M12, the output terminal O2, the magnetic head 4, the output terminal O1, and the transistor Q51.

When the output polarity of the switching signal source S11 is negative and the output polarity of the switching signal source S12 is positive, the ON/OFF states of the MOS transistors M12, M511, and M522 and the MOS transistors M11, M512, and M521 are reversed, thereby reversing the drive current for the magnetic head 4.

A voltage for preventing clamping of a flyback pulse generated upon reversing the drive current will be taken into consideration. The transistor Q52 of the constant current source I52 is the same as the transistor Q25 of the constant current source I21 of the conventional example. A voltage across the resistor R52 is set at 0.3 V, and the collector-emitter voltage of the transistor Q52 is set at 0.5 V. The minimum collector potential of the transistor Q52 is set at 0.8 V. A necessary source-drain voltage of the MOS transistor M11 to keep it on is about 0.3 V as in the first embodiment. The limit of preventing clamping of the flyback pulse generated by the magnetic head 4 is 3.9 V (=5.0 V−0.3 V−0.8 V) as in the calculation of the conventional example. This limit is higher than the conventional example by 1.1 V.

As described above, a magnetic head drive circuit of the present invention can have a voltage for preventing clamping of a flyback pulse generated by the inductance of the magnetic head can be increased. Therefore, the reversing speed of the magnetic drive current can be increased, and the write speed can also be increased.

What is claimed is:

1. A magnetic head drive circuit comprising:
a first MOS transistor of a first conductivity type having a source connected to a first power supply;
a first bipolar transistor of a second conductivity type connected in series with said first MOS transistor and having a common node thereof as a first output terminal, an emitter connected to a second power supply, and a collector current controlled as a constant current;
a second MOS transistor of the first conductivity type having a source connected to said first power supply;
a second bipolar transistor of the second conductivity type connected in series with said second MOS transistor and having a common node thereof as a second output terminal, an emitter connected to said second power supply, and a collector current controlled as a constant current; and
a first constant current circuit connected between said second power supply and a common node between emitters of said first and second bipolar transistors.

2. A circuit according to claim 1, further comprising a magnetic head connected between said first and second output terminals, and wherein a pair of said first MOS transistor and said second bipolar transistor and a pair of said second MOS transistor and said first bipolar transistor are complementarily turned on and off to constitute a bridge circuit for supplying currents in both directions.

3. A magnetic head drive circuit comprising:
a first MOS transistor of a first conductivity type having a source connected to a first power supply;
a first bipolar transistor of a second conductivity type connected in series with said first MOS transistor and having a common node thereof as a first output terminal, an emitter connected to a second power supply, and a collector current controlled as a constant current;
a second MOS transistor of the first conductivity type having a source connected to said first power supply;
a second bipolar transistor of the second conductivity type connected in series with said second MOS transistor and having a common node thereof as a second output terminal, an emitter connected to said second power supply, and a collector current controlled as a constant current; and
first switching means for selectively switching a base of said first bipolar transistor to an output of a reference current source or said second power supply, and second switching means for selectively switching a base of said second bipolar transistor to said output of said reference current source or the second constant current source, said first switching means constituting a second constant current source together with said first bipolar transistor, and said second switching means constituting a third constant current circuit together with said second bipolar transistor.

4. A circuit according to claim 3, wherein said first switching means comprises a third MOS transistor of the first conductivity type connected between said base of said first bipolar transistor and said output of said reference current source and a fourth MOS transistor of the second conductivity type connected between said base of said first bipolar transistor and said second power supply, and said second switching means comprises a fifth MOS transistor of the first conductivity type connected between said base of said second bipolar transistor and said output of said reference current source and a sixth MOS transistor of the second conductivity type connected between said base of said second bipolar transistor and said second power supply.

5. A circuit according to claim 3, further comprising a magnetic head connected between said first and second output terminals, and wherein a pair of said first MOS transistor and said second bipolar transistor and a pair of said second MOS transistor and said first bipolar transistor are complementarily turned on and off to constitute a bridge circuit for supplying currents in both directions.

* * * * *